(12) United States Patent
Radovanov et al.

(10) Patent No.: US 10,468,224 B2
(45) Date of Patent: Nov. 5, 2019

(54) APPARATUS AND METHOD FOR CONTROLLING ION BEAM PROPERTIES USING ENERGY FILTER

(71) Applicant: Varian Semiconductor Equipment Associates, Inc., Gloucester, MA (US)

(72) Inventors: Svetlana Radovanov, Brookline, MA (US); Ana Samolov, Somerville, MA (US); Shengwu Chang, South Hamilton, MA (US); Frank Sinclair, Boston, MA (US); Peter L. Kellerman, Essex, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 15/948,736

(22) Filed: Apr. 9, 2018

(65) Prior Publication Data

US 2019/0198283 A1 Jun. 27, 2019

Related U.S. Application Data

(60) Provisional application No. 62/608,879, filed on Dec. 21, 2017.

(51) Int. Cl.
*H01J 37/05* (2006.01)
*H01J 37/12* (2006.01)
*H01J 37/317* (2006.01)

(52) U.S. Cl.
CPC .............. *H01J 37/05* (2013.01); *H01J 37/12* (2013.01); *H01J 37/3171* (2013.01); *H01J 2237/057* (2013.01)

(58) Field of Classification Search
CPC .. H01J 37/3171; H01J 37/12; H01J 2237/053; H01J 2237/151; H01J 37/1477; H01J 2237/04756; H01J 2237/24542; H01J 37/147; H01J 37/3007; H01J 2237/0475; H01J 2237/083; H01J 2237/30472;
(Continued)

(56) References Cited

U.S. PATENT DOCUMENTS

| | | | |
|---|---|---|---|
| 4,766,320 A * | 8/1988 | Naitoh | H01J 37/3002 250/281 |
| 6,441,382 B1 * | 8/2002 | Huang | H01J 37/3171 250/492.21 |

(Continued)

OTHER PUBLICATIONS

International Search Report and Written Opinion dated Apr. 25, 2019, for PCT application PCT/US2018/065160 filed Dec. 12, 2018.

*Primary Examiner* — David A Vanore

(57) ABSTRACT

An apparatus may include an electrode assembly, the electrode assembly comprising a plurality of electrodes, arranged in a plurality of electrode pairs arranged to conduct an ion beam therethrough. A given electrode pair lies along a radius of an arc describing a nominal central ray trajectory, wherein a radius of a first electrode pair and an adjacent electrode pair define an angular spacing. The plurality of electrode pairs may define a plurality of angular spacings, wherein, in a first configuration, the plurality of angular spacings are not all equal. The apparatus may also include a power supply in communication with the EM, the power supply configured to independently supply voltage to the plurality of electrodes.

16 Claims, 5 Drawing Sheets

(58) Field of Classification Search
CPC ......... H01J 2237/31705; H01J 37/1471; H01J 49/061; H01J 49/22; H01J 49/48
USPC ... 250/396 R, 423 R, 424, 492.21, 281, 398, 250/492.2, 492.3
See application file for complete search history.

(56) References Cited

U.S. PATENT DOCUMENTS

| | | | | |
|---|---|---|---|---|
| 7,888,653 | B2* | 2/2011 | Kellerman | H01J 37/12 250/396 R |
| 9,281,162 | B2* | 3/2016 | White | H01J 37/1472 |
| 9,293,295 | B2* | 3/2016 | Yagita | H01J 37/147 |
| 9,502,213 | B2* | 11/2016 | Hohto | H01J 37/3171 |
| 9,583,308 | B1* | 2/2017 | Lee | H01J 37/08 |
| 9,721,750 | B2* | 8/2017 | Lee | H01J 37/05 |
| 10,068,758 | B2* | 9/2018 | Likhanskii | H01J 49/22 |
| 2009/0121149 | A1* | 5/2009 | Radovanov | H01J 37/12 250/396 R |
| 2011/0155921 | A1* | 6/2011 | Kellerman | H01J 37/1477 250/396 R |
| 2011/0297843 | A1* | 12/2011 | Igo | H01J 37/147 250/396 R |
| 2012/0168637 | A1* | 7/2012 | Radovanov | H01J 37/12 250/396 R |
| 2013/0255577 | A1* | 10/2013 | Chang | H01J 27/028 118/723 R |
| 2014/0034843 | A1 | 2/2014 | Naumovski et al. | |
| 2014/0261171 | A1 | 9/2014 | Hahto et al. | |
| 2014/0345522 | A1 | 11/2014 | Kabasawa et al. | |
| 2015/0187450 | A1* | 7/2015 | Chang | G21K 1/14 315/506 |
| 2015/0279612 | A1 | 10/2015 | Yagita | |
| 2018/0269033 | A1* | 9/2018 | Sinclair | H01J 37/3171 |

* cited by examiner

APPARATUS AND METHOD FOR CONTROLLING ION BEAM PROPERTIES USING ENERGY FILTER

RELATED APPLICATIONS

This application claims priority to U.S. Provisional Patent application No. 62/608,879, filed Dec. 21, 2017, entitled APPARATUS AND METHOD FOR CONTROLLING ION BEAM PROPERTIES USING ENERGY FILTER, and incorporated by reference herein in its entirety.

FIELD OF THE DISCLOSURE

The disclosure relates generally to techniques for implanting substrates, and more particularly, to components and techniques for improving ion beams transported through energy filters.

BACKGROUND OF THE DISCLOSURE

Ion implantation is a process of introducing dopants or impurities into a substrate via bombardment. In semiconductor manufacturing, the dopants are introduced to alter electrical, optical, or mechanical properties.

Ion implantation systems may comprise an ion source and a series of beam-line components. The ion source may comprise a chamber where ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp. The substrate may be moved in one or more dimensions (e.g., translate, rotate, and tilt) by an apparatus, sometimes referred to as a roplat.

In many ion implanters a downstream electrostatic module, may function as an electrostatic lens to control ion beam energy, ion beam shape, and ion beam size. The electrostatic module may accelerate or decelerate an ion beam to a final energy, while altering the direction of the ion beam. By altering the direction of the ion beam, energetic neutrals may be screened out, resulting in a final beam having a well-defined energy.

Known electrostatic modules may employ, for example, multiple pairs of electrodes, such as seven upper and lower electrodes arranged in pairs, where the electrodes bound and guide an ion beam traveling therethrough. The electrodes may be arranged as rods spaced equidistant from an ion beam. The rod/electrode potentials are set to create electric fields in the electrostatic module causing the ion beam to decelerate, deflect and focus while maintaining the constraint wherein all rod/electrode voltages remain negative with respect to the downstream beamline. Another feature of such electrostatic module is the equiangular spacing between successive pairs of electrodes. This arrangement allows more simple calculation and setting of electrode potentials to generate a targeted set of ion beam properties. The known design of electrostatic modules may limit the ability to improve properties such as beam current and beam focus, especially in the case of low-energy or high-perveance ion beams.

With respect to these and other considerations, the present disclosure is provided.

BRIEF SUMMARY

In one embodiment, an apparatus may include an electrode assembly, where the electrode assembly includes a plurality of electrodes, arranged in a plurality of electrode pairs arranged to conduct an ion beam therethrough. A given electrode pair lies along a radius of an arc describing a nominal central ray trajectory, wherein a radius of a first electrode pair and an adjacent electrode pair define an angular spacing. The plurality of electrode pairs may define a plurality of angular spacings, wherein, in a first configuration, the plurality of angular spacings are not all equal. The apparatus may also include a power supply in communication with the electrode assembly, the power supply configured to independently supply voltage to the plurality of electrodes.

In a further embodiment, a method for controlling an ion beam may include directing the ion beam through an electrode assembly of an electrostatic lens, where the electrode assembly includes a plurality of electrodes. The method may include assigning a plurality of electrode voltages to the plurality of electrodes, wherein the plurality of electrode voltages define a first deceleration length in a first operating mode for a first ion beam having a first perveance. The method may also include decreasing the deceleration length of the electrode assembly in a second operating mode for a second ion beam having a second perveance, greater than the first perveance.

In an additional embodiment, a method for controlling an ion beam may include directing the ion beam through an electrode assembly of an electrostatic lens, the electrode assembly comprising a plurality of electrodes. The method may further include assigning a plurality of unadjusted electrode voltages to the plurality of electrodes in order to conduct the ion beam along an arc defining a nominal central ray trajectory. The method may additionally include adjusting the plurality of unadjusted electrode voltages to a set of adjusted electrode voltages, wherein an actual beam path deviates from the central ray trajectory, wherein at least one beam feature of the ion beam is altered.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

A system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved transport and control of an ion beam at a deceleration stage, for example. In exemplary embodiments, an EM type component is provided, employing an improved configuration, providing flexibility in treatment of an ion beam, improved beam properties, and improved serviceability. In various embodiments, an electrode assembly provides easy removal of rods/electrodes to be cleaned from the accumulated deposits. In addition, beam current transported through the EM may be increased with respect to known EM components, especially for low energy, high perveance ion beams.

Figure 1:
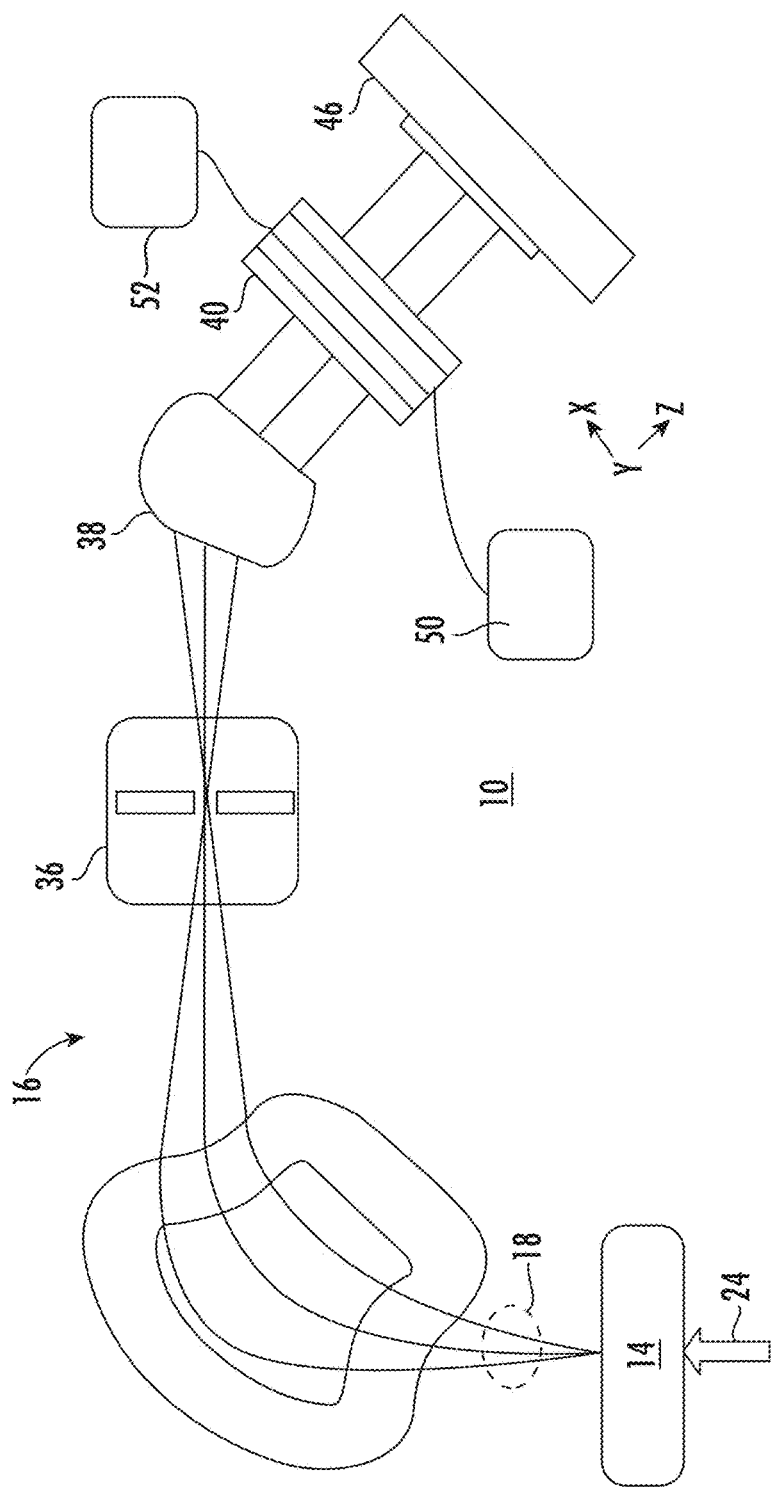
FIG. 1 shows an exemplary embodiment demonstrating a system, according to embodiments of the disclosure.

Referring now to FIG. 1, an exemplary embodiment demonstrating a system 10 is shown, where the system 10 may be used for ion implantation system in accordance with the present disclosure. The system 10 includes, among other components, an ion source 14 for producing an ion beam 18, such as a ribbon beam or a spot beam, and a series of beam-line components. In FIG. 1, the arcuate arrow shown as ion beam 18 may also represent the position of the central ray trajectory (CRT) of the ion beam 18. The ion source 14 may comprise a chamber for receiving a flow of gas 24 and generates ions. The ion source 14 may also comprise a power source and an extraction electrode assembly disposed near the chamber. The beam-line components 16 may include, for example, a mass analyzer 34, a first acceleration or deceleration stage 36, a collimator 38, and an electrostatic module (EM) 40 corresponding to a second acceleration or deceleration stage.

In exemplary embodiments, the beam-line components 16 may filter, focus, and manipulate ions or the ion beam 18 to have a particular species, shape, energy, and/or other qualities. The ion beam 18 passing through the beam-line components 16 may be directed toward a substrate mounted on a platen or clamp within a process chamber 46. The substrate may be moved in one or more dimensions (e.g., translate, rotate, and tilt).

The EM 40 is a beam-line component configured to independently control deflection, deceleration, and focus of the ion beam 18. In some embodiments, the EM 40 is a vertical electrostatic energy filter (VEEF) or electrostatic filter (EF). As will be described in greater detail below, the EM 40 may be arranged as an electrode assembly defining at least one electrode configuration. The electrode configuration may include a set of upper electrodes disposed above the ion beam 18 and a set of lower electrodes disposed below the ion beam 18. A difference in potentials between the set of upper electrodes and the set of lower electrodes may also be varied along the central ion beam trajectory to deflect the ion beam at various points along the central ray trajectory (CRT). The system 10 may further include an electrode voltage supply, shown as voltage supply 50, and electrode drive 52, where the operation is described in more detail below.

Figure 2A:
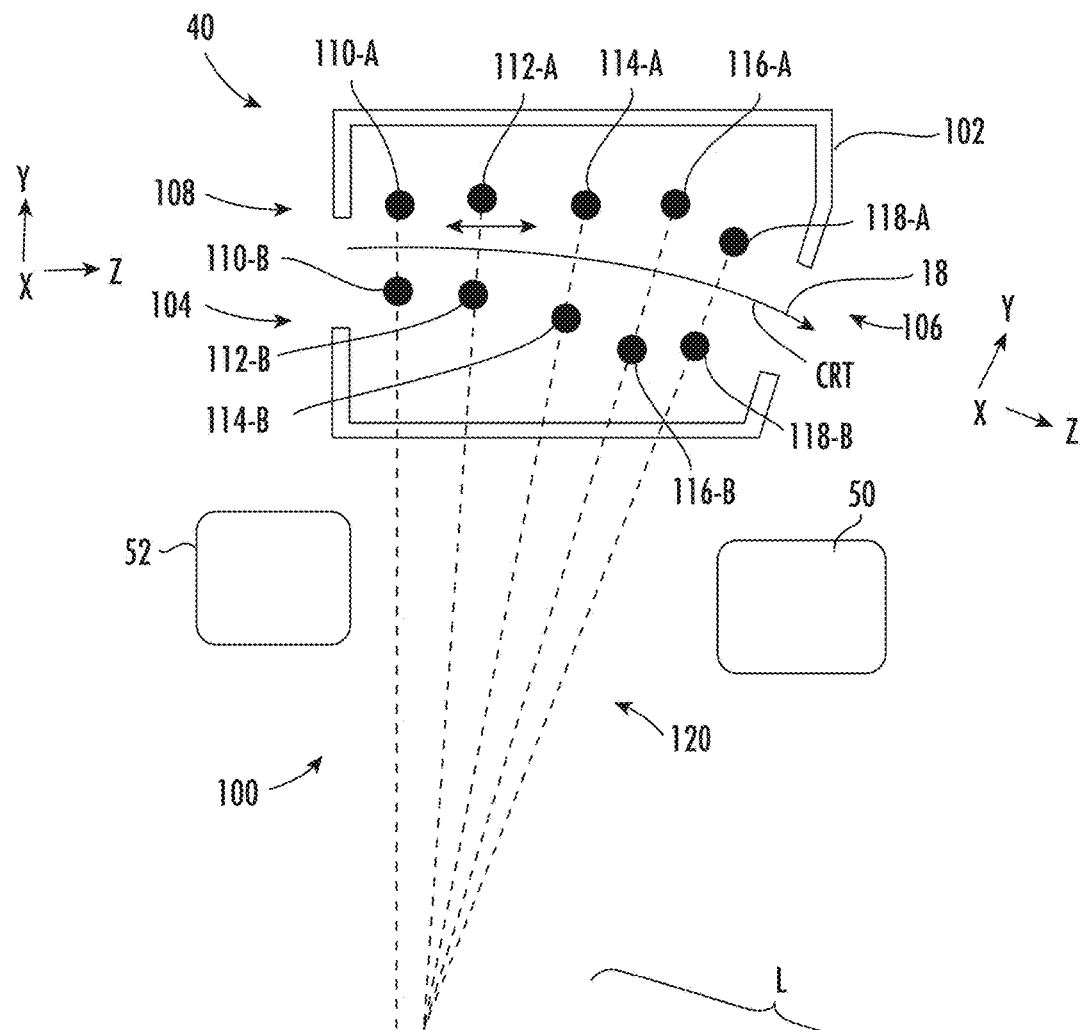
FIGS. 2A-B show the structure and operation of an EM according to exemplary embodiments of the disclosure.
Figure 2B:
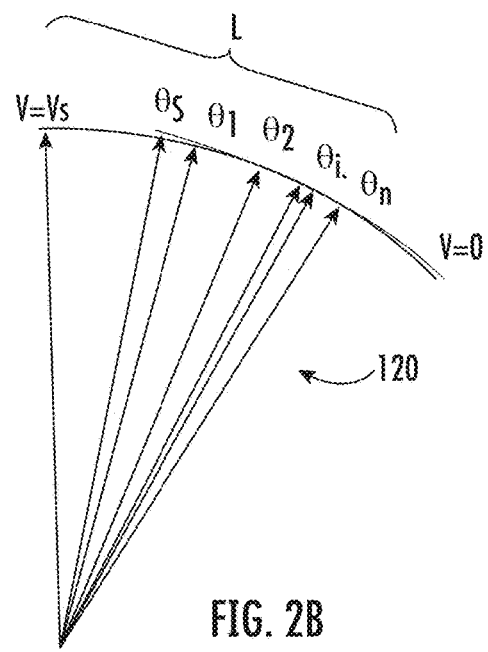

Referring now to FIGS. 2A-B, the structure and operation of an EM 40 according to exemplary embodiments will be described in greater detail. In FIG. 2A, there is shown a side cross-sectional view of an EM system 100, including the EM 40, voltage supply 50, and electrode drive 52. As shown, the EM 40 includes an EM chamber 102, extending above and partially encasing EM 40, leaving an entrance aperture 104 and exit aperture 106 to conduct the ion beam 18 therethrough. The EM 40 includes electrode assembly 108, made of a plurality of electrode pairs, where a given electrode in an electrode pair is denoted by the suffix "A" for upper electrodes (electrode 110-A to electrode 118-A), above the ion beam 18, and denoted with the suffix "B" for lower electrodes (electrode 110-B to electrode 118-B). In accordance with various embodiments, the electrodes of electrode assembly 108 may be elongated along the X-axis of the Cartesian coordinate system shown. As such, the electrodes may be useful for controlling a ribbon beam having a cross-section, also elongated along the X-axis, where the ribbon beam may be tens of centimeters wide along the X-axis and may have a height on the order of several centimeters. The embodiments are not limited in this context.

The voltage supply 50 may be arranged to supply voltage to the electrodes of electrode assembly 108, independently of one another. In some embodiments, the upper and lower electrode of an electrode pair may be electrically coupled to one another. In some embodiments, upper and lower electrodes of each electrode pair may have different potentials (e.g., in separate conductive pieces) in order to deflect the ion beam 18 passing therethrough. In various embodiments, the voltage supply 50 may include a voltage routine to calculate and direct voltages to the electrode assembly 108, as described below in more detail. The voltage routine may be implemented in software, a combination of software and hardware, and may be executed using code stored in at least one computer readable medium in some embodiments.

In some embodiments, the ion beam 18, passing through the electrode assembly 108, may include boron, phosphorous, arsenic, or other elements to be used for implantation. Electrostatic focusing of the ion beam 18 may be achieved by using different electrodes to control grading of potential along the ion beam-line. As a result, use of input ion beams may be used in an energy range to enable higher quality beams, even for very low energy output beams. In one non-limiting example, as the ion beam 18 passes through the electrodes of the electrode assembly 108, the ion beam 18 may be decelerated to a final energy of 10 keV or less, 5 keV or less, or 1 keV or less. The ion beam 18 may also be deflected through an arbitrary angle, for example, 20 degrees. The ion beam 18 thus enters the EM to the left and exits with an exit trajectory to the right, where the exit trajectory may be manipulated between different operating modes. In some examples, the exit trajectory in a given mode may be maintained to be a nominal trajectory of another mode, while other properties such as the deceleration length of the EM 40, are changed between the different modes.

In accordance with various embodiments, the EM 40 may be configured to operate with a similar size as known EMs to provide a similar arc length, as known EMs, as detailed below. Accordingly, the deceleration, deflection and focusing of an ion beam passing through EM 40 may be performed over a similar arc length as in known EMs. Turning also to FIG. 2B, there is shown a schematic illustration of the electrode geometry of an EM according to embodiments of the disclosure. According to various embodiments, an electrode assembly may be arranged over an arc length corresponding to the total angle of deflection θ, where the arc length L represents the length of an arc defining the path of ion beam 18 between an entrance electrode (see electrodes 110-A, 110-B) and exit electrode (see electrodes 118-A, 118-B).

As shown in FIG. 2B, the various rays, shown as rays 120 may represent the angular positions defining the location of a pair of electrodes, such as electrode 110-A and electrode 110-B. As shown in FIG. 2B, in various embodiments, the electrodes are disposed along the arc at unequal angular intervals, unlike the configuration of known EMs. The unequal angular intervals are illustrated in FIG. 2B where the angle θ between successive rays of rays 120 defining the electrode pairs varies along the arc length.

In accordance with various embodiments, a second pair of electrodes (immediately adjacent and downstream of the entrance electrodes, meaning closer to the exit aperture 106), shown as electrode 112-A and electrode 112-B, may be arranged as suppression electrodes. According to some embodiments, the deceleration length, denoting the distance along the arc length from the position of suppression electrodes to the ground electrodes (see electrode 118-A and electrode 118-B), is shorter compared to known EMs. Accordingly, while the total arc length between entrance electrode and exit electrode (110-118) may be the same as in known EMs, the suppression electrodes may be positioned to reduce the deceleration length. Said differently, the ratio of the deceleration length to total arc length may be less in the EM 40 as compared to known EMs. Advantageously, the decreased deceleration length may increase beam current for a given ion species at a given ion energy, and ultimately increase substrate throughput.

In accordance with some embodiments, the relative position of at least some of the electrodes may be adjustable, either manually, or remotely. For example, the suppression electrode 112-A and suppression electrode 112-B may be adjustable in terms of the relative position along the arc. The same applies for electrode 114-A and electrode 114-B, or other electrodes. In one embodiment, the electrode drive 52 may be configured to allow a user to remotely move electrodes within the electrode assembly 108, such as from a first electrode position to a second electrode position. Accordingly to some embodiments, in a first configuration the pairs of electrodes may be spaced at unequal angular intervals in a first configuration, while the pairs of electrodes may be spaced at equal angular intervals (equal angular spacings) in a second configuration. The second configuration may be suitable for operation when relatively low perveance ion beams, such as ion beams having ion energy greater than 20 kV, are directed through the EM 40.

As noted, the function of the EM 40 may include decelerating, bending (deflecting) and focusing of the ion beam 18.

In various embodiments, a voltage routine may be implemented to assign voltages to electrodes of an EM based upon specific algorithms, as detailed below. In some embodiments of the disclosure, the electric fields and voltages to be applied to electrodes of an electrode assembly may be calculated based upon a so-called alpha algorithm. The electric field generated by electrodes in an EM may be considered as the superposition of three fields, while a constraint imposed wherein all the electrode voltages remain negative with respect downstream components. A general equation of the voltage on a CRT may be given by:

$$V_{crt}(i) = V_{ss}\left(\frac{\theta_n - \theta_i}{\theta_s - \theta_n}\right)^\alpha \quad (1)$$

where $V_{ss}=-D_1-V_s$, $\theta_i$-electrode angular position, $\theta_n$-0 is ground electrode angular position, $\theta_S$ is suppression electrode angular position, $D_1$ is deceleration potential, $V_s$ is suppression voltage, $\theta_S-\theta_n$ is the deceleration length, and $\theta_S-\theta_{n-1}$ is the deflection length.

In the above equation, the ground electrode may be the final (most downstream) electrode of an electrode assembly. In accordance with various embodiments, where the electrodes of an electrode assembly are arranged at unequal angular intervals, modifications may be applied to the so-called alpha algorithm for calculating a voltage grading in the electrode assembly between the suppression and ground rods/electrodes assuming n pairs of rods/electrodes. Furthermore, the actual path of the ion beam, such as the center of the ion beam, may be allowed to deviate from the nominal central ray trajectory as defined by the electrode assembly central line.

In various embodiments, the ion beam may travel along an arcuate path, while the deflection length needed for vertical beam angle correction is shorter compared to known EMs having similar arc length. In some embodiments, deflection and focusing fields in the EMs may act over different lengths along the arcuate path of the electrode assembly, allowing the ion beam to travel at an actual trajectory or actual path deviating from the CRT, as noted.

The following equation defines the ion energy along the arcuate path in the graded lens and is used for the lens deceleration grading to control beam focus and residual energy contamination:

Alpha algorithm $$U_i = U_f + U_s\left[\frac{(\theta_n - \theta_i)}{(\theta_n - \theta_s)}\right]^\alpha \quad (2)$$

where $U_i$ is ion energy function along the crt, $U_f$ is final ion energy, $U_S$ is ion energy at the suppression electrode.

The superposition of deceleration and deflection voltage distribution is given by the following equation:

$$V_{i,inner}^{outer} = \frac{U_f}{q} + \frac{U_s}{q}\left[\frac{(\theta_n - \theta_i)}{(\theta_n - \theta_s)}\right]^\alpha \pm \frac{2g_i f U_i}{q} \quad (3)$$

where $g_i$ is electrode gap, $$f = \frac{d\theta}{dz}$$

the detection factor, and q is ion charge.

Assuming linear deflection along the length of the lens, the above equation for the rod/electrode voltages grading transforms into following:

$$V_{inner}^{outer} = \frac{U_f}{q} + \frac{U_s}{q}\left[\frac{(\theta_n - \theta_i)}{(\theta_n - \theta_s)}\right]^\alpha \pm \frac{2g_i U_i}{q}\left[D + C*R\left((\theta_i - \theta_s) - \frac{(\theta_{n-1} - \theta_s)}{2}\right)\right] \quad (4)$$

where C and D represent virtual tuning knobs for the ion beam angle control, while R is the radius of the arcuate center line of the electrode assembly.

According to embodiments of the disclosure, control of the effective deceleration and deflection lengths and focus is accomplished by carefully choosing $\theta_S$ and $\theta_n$ ($\theta_S$–$\theta_n$)— deceleration length and ($\theta_S$–$\theta_{n-1}$)—deflection length).

The increase in the focusing power of an EM is useful for transport of high perveance beams dominated by space-charge defocus. Numerical analysis has shown focusing power of the EM scales with perveance (P) of an ion beam, such as a ribbon beam, by $$\frac{d}{PL^2};$$

where $$P = \frac{Jd}{4\varepsilon_0}\sqrt{\frac{m}{2qeV^3}},$$

the perveance of the ribbon beam, where d is height of the beam/fill factor, and L is deceleration length. From this scaling rule an increase in d by ~20% and decrease in L by ~30% results in the increase of transported ion beam current by the factor of 1.20/0.7²=2.44.

Figure 3:
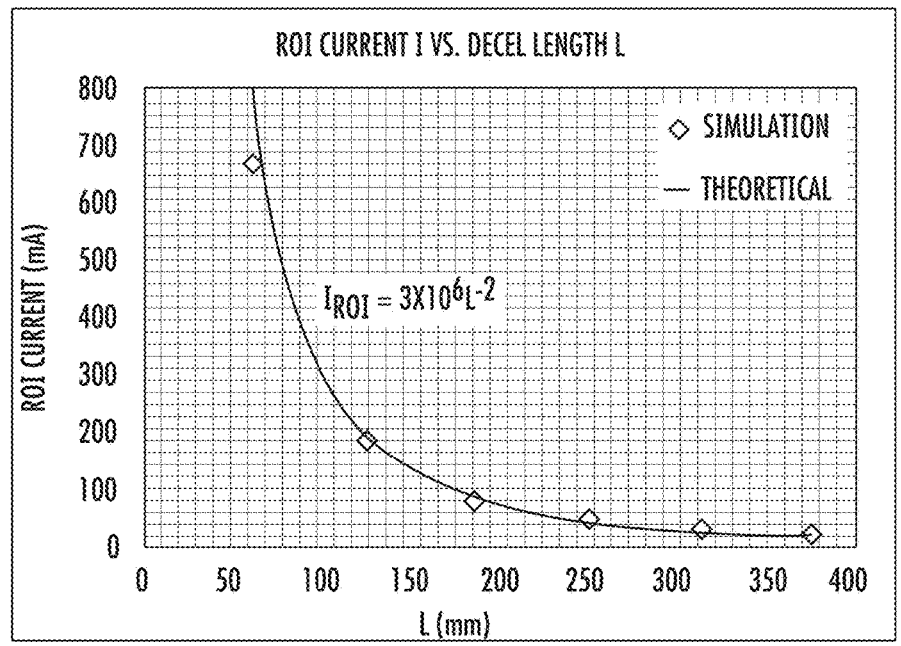
FIG. 3 illustrates modeling results showing the results of simulation of beam current at a substrate as a function of the deceleration length.

FIG. 3 illustrates modeling results showing the results of simulation of beam current at a substrate (ROI) as a function of the deceleration length as defined in the above equations. The results of FIG. 3 reveal the beam current increases substantially below L values of 250 mm, and especially rapidly below 200 mm. A benefit of the present embodiments is the ability to adjust the deceleration length and deflection length to increase or maximize beam transport through a EM over a wide range of beam energies. For example, at energies <1 keV, using a shorter deceleration length one can obtain significant increase in ion beam current, as shown in FIG. 3. For energies <5 keV both shorter deceleration length and deflection lengths are optimal for enhanced beam transport. At energies of 20 keV and above an extended deflection length is needed for angle correction, while an extended deceleration length helps reduce aberrations.

In view of the above results, and in accordance with various embodiments of the disclosure, an electrostatic module may be arranged so the deceleration length is arranged to be substantially shorter than the deceleration of known electrostatic module configurations. Thus, for a same form factor, where the path length between a first set of electrodes and a set of ground electrodes is the same, the deceleration length of known EMs having electrode pairs spaced at equal angles may exceed the deceleration length of an EM arranged according to the present embodiments by ten percent or more.

Figure 4A:
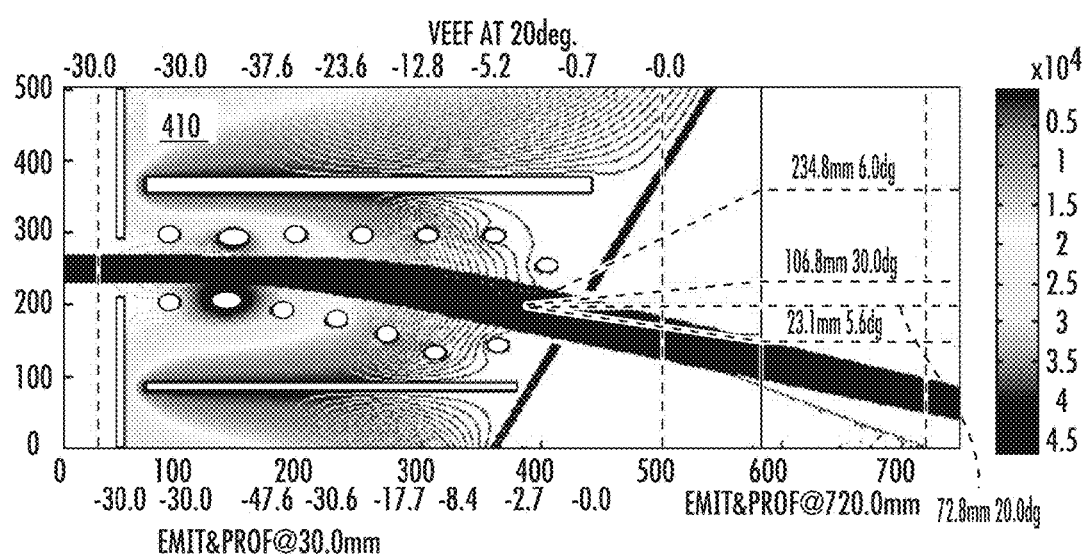
FIG. 4A and FIG. 4B present results of modeling of a low energy ion beam transported through a reference electrode assembly and an electrode assembly according to an embodiment of the disclosure, respectively.
Figure 4B:
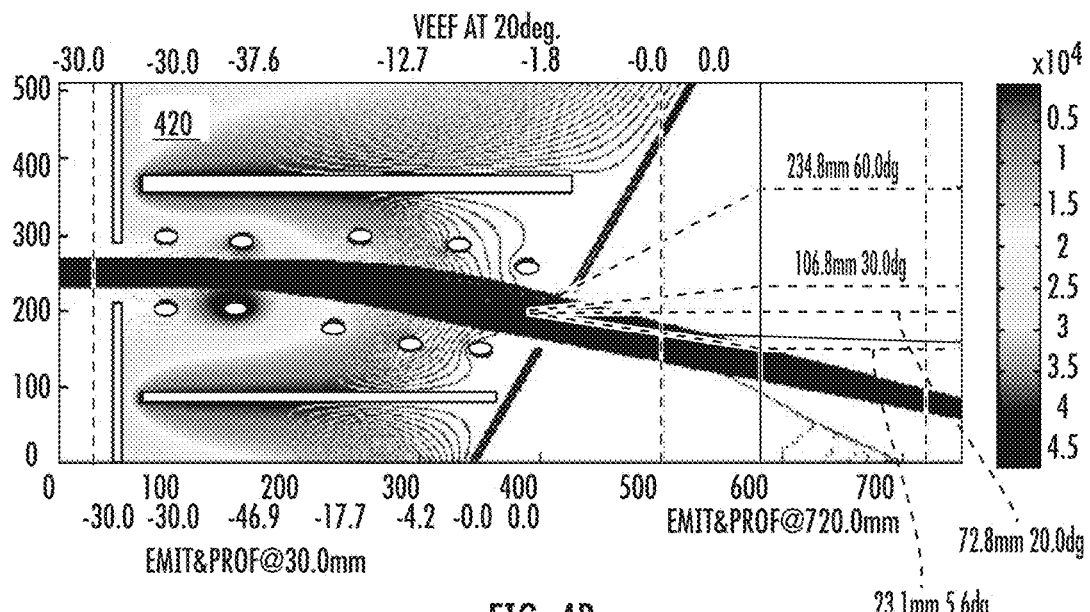

The more compact arrangement of an EM of the present embodiments may also provide other benefits. According to various embodiments, the electrodes in an electrode assembly of an EM may be arranged to improve focusing power. FIG. 4A and FIG. 4B present results of modeling of a low energy ion beam transported through a reference electrode assembly and an electrode assembly according to an embodiment of the disclosure, respectively. The reference electrode assembly 410 of FIG. 4A and the electrode assembly 420 of FIG. 4B employ an EM having the same dimensions, and having the same distance between entrance electrodes (furthest to the left) and ground electrodes (furthest to the right). The reference electrode assembly 410 employs seven electrode pairs, while the electrode assembly 420 employs five pairs of electrodes. Another difference is where the second electrode pair, the suppresssion electrodes, of the electrode assembly 420, are positioned downstream with respect to a corresponding suppression electrodes in the reference electrode assembly 410 (the second pair of electrodes in the reference electrode assembly 410 are also suppression electrodes). Said differently, the angular spread between the first electrode pair and second electrode pair is larger in the electrode assembly 420. As a result, the deceleration length, the arc length between the suppression electrodes and ground electrodes, is less in the electrode assembly 420.

In the simulations of FIG. 4A and FIG. 4B, transport of a 3 keV phosphorous ($P^+$) ion beam is shown, at 33 to 3 keV deceleration ratio. In these simulations, the reference electrode assembly 410 has an effective deceleration length of L=250 mm, while the electrode assembly 420 has a deceleration length of L=225 mm. The results show the electrode assembly 420 produces greater focusing, wherein the reference electrode assembly 410 generates a taller ion beam at the substrate, compared to the electrode assembly 420, when the vertical cross over occurs past the substrate plane. The focusing power of the electrode assembly may be deemed to be increased by 45% with respect to the reference electrode assembly.

Figure 5:
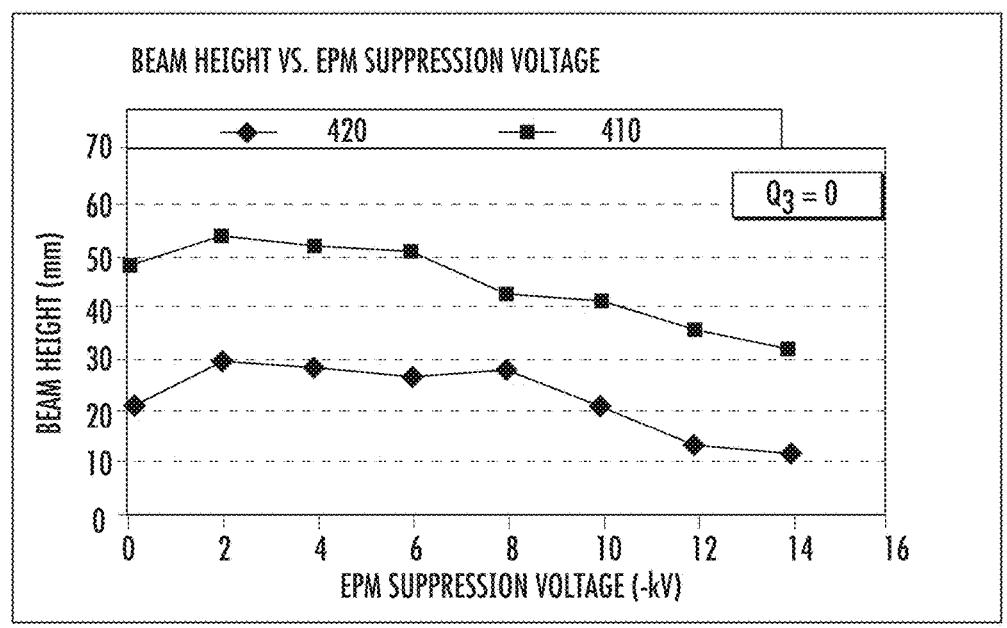
FIG. 5 shows the results of simulations of beam height as a function of suppression voltage for two different electrode assemblies.

Turning now to FIG. 5 there is shown the results of simulations of beam height as a function of suppression voltage for a 3 keV P+ ion beam with a 33 to 3 keV deceleration ratio for a reference electrode assembly 410 and electrode assembly 420. As shown, for low energy beams, over the suppression voltage range shown, the beam height is substantially smaller for the electrode assembly 420, arranged with a shorter deceleration length, according to embodiments of this disclosure.

In accordance with various embodiments of the disclosure, a graded lens (electrode assembly) having an arbitrary number of electrodes, with or without a deflection field, may have tailored deceleration and deflection voltage distributions controlled through a computer program code. This computer program code combined with a certain rod/electrode wiring, may easily rearrange potential distributions to form a different lens structure with a desired focusing, deceleration and deflection to match beam perveance. Such a system may employ isolated lens modules, which modules can be easily rewired to enable variable deceleration, deflection and focus regions.

Figure 6:
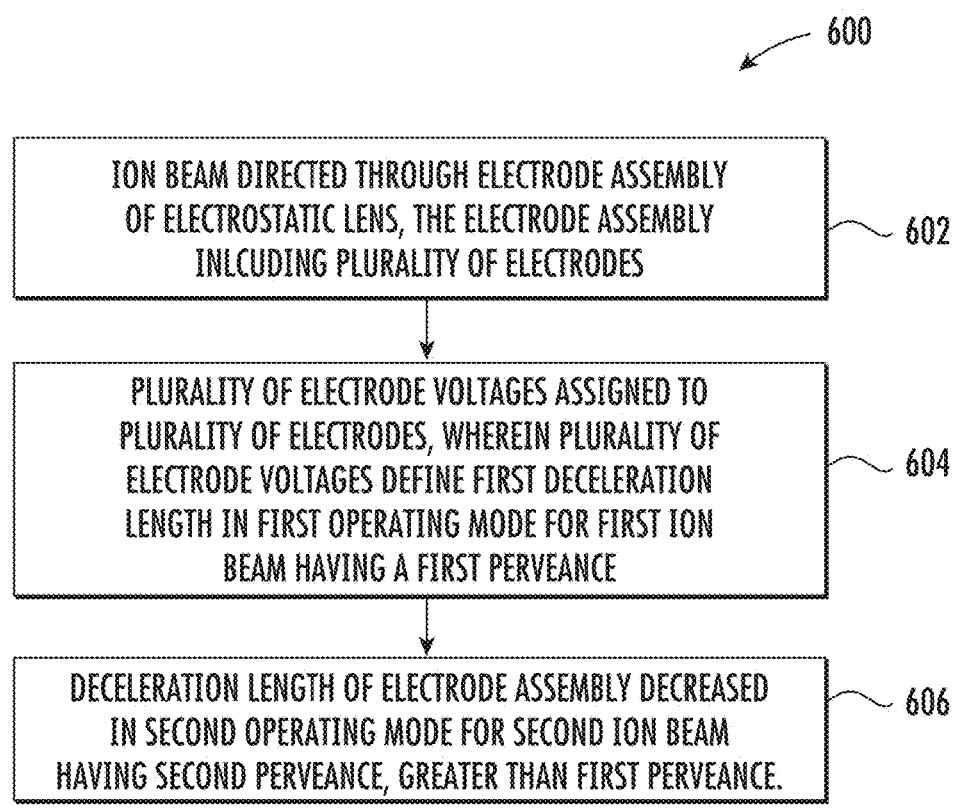
FIG. 6 depicts an exemplary process flow according to some embodiments of the disclosure.

FIG. 6 depicts an exemplary process flow 600 according to some embodiments of the disclosure. At block 602, an ion beam is directed through an electrode assembly of an electrostatic lens. The ion beam may be a ribbon beam in some embodiments, and the electrode assembly may include a plurality of electrodes. At block 604 a plurality of electrode voltages is assigned to the plurality of electrodes, wherein the plurality of electrode voltages define a first deceleration length in a first operating mode for a first ion beam having a first perveance. In some instances, a beam terminal voltage may be assigned to a first pair of electrodes, disposed at an entrance of the electrode assembly.

At block 606 the deceleration length of the electrode assembly is decreased to a second deceleration length in a second operating mode for a second ion beam having a second perveance, greater than the first perveance. The deceleration length may be reduced by 5%, 10%, or 20% between operating modes in some embodiments.

In summary, the present embodiments provide an EM embodied as a graded deceleration lens (electrostatic lens), using rods/electrodes disposed at unequal angular intervals along an arc. Various embodiments provide a method of controlling effective deflection and deceleration lengths in the EM. In particular embodiments, a method for controlling an ion beam may include a computer code for assigning electrode voltages within a deceleration/deflection lens where the deceleration/deflection lengths are adjusted to match beam perveance, according to the scaling law. The method may be exemplified in Eqs 1-4, to assign a plurality of voltages to the electrodes of the EM, including beam terminal voltage, deflection voltage, in a manner where the voltages adjust the deceleration length and/or deflection length to match the beam perveance. As an example, in embodiments having a given number of electrode pairs, alternatively to or in addition to moving an electrode pair, the deceleration length may be adjusted by switching assignment of voltages between different electrode pairs so a second electrode pair becomes the pair of suppression electrodes, as opposed to a first electrode pair.

One result of switching of assignments of voltages to different electrode pairs is the ability to direct an ion beam along an actual path different from the nominal central ray trajectory defined by the central line of the electrode assembly to achieve control over energy contamination at the wafer plane. In certain embodiments, a "knob" is provided to control the deflection length to achieve a mean beam angle different from zero. This control may be significant for material processing where real-time angle control is needed, such as patterning.

In particular embodiments a set of unadjusted electrode voltages may cause the ion beam to impinge on a substrate at a first angle of incidence, while an adjusted set of electrode voltages causes the ion beam to impinge on the substrate at a second angle of incidence, different from the first angle of incidence.

In view of the foregoing, at least the following advantages are achieved by the embodiments disclosed herein. An adjustable deceleration/deflection length in a graded lens (electrode assembly) is realized by the EMs of the present disclosure. One advantage is the improved beam transport in the EM that is enabled for high perveance beams. Another advantage is the lower beam aberrations, achievable to obtain parallel beam in the deceleration region to enable good balance between the electrostatic focus and space charge defocus. Increased throughput, i.e., beam current transported through the EM is provided by embodiments of the disclosure. Improved serviceability of a graded lens is provided in some embodiments.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An apparatus, comprising:
an electrode assembly, the electrode assembly comprising a plurality of electrodes, arranged in a plurality of electrode pairs arranged to conduct an ion beam therethrough, wherein a given electrode pair lies along a radius of an arc describing a nominal central ray trajectory, wherein a radius of a first electrode pair and an adjacent electrode pair define an angular spacing, wherein the plurality of electrode pairs defines a plurality of angular spacings, wherein, in a first configuration, the plurality of angular spacings are not all equal; and
a power supply in communication with the electrode assembly, the power supply configured to independently supply voltage to the plurality of electrodes.

2. The apparatus of claim 1, wherein at least one electrode of the electrode assembly is movable from a first electrode position to a second electrode position.

3. The apparatus of claim 1, wherein the arc defines a path length between a first set of electrodes and a set of ground electrodes, wherein, in a first configuration, a deceleration length of the electrode assembly is a first length, wherein the deceleration length equals a distance along the arc from a position of a set of suppression electrodes to a position of the set of ground electrodes, wherein, in a second configuration where the electrode assembly defines all equal angular spacings of electrodes, the deceleration length is a second length, the second length exceeding the first length by ten percent or more.

4. The apparatus of claim 3, wherein the set of suppression electrodes comprise a second set of electrodes of the electrode assembly, immediately adjacent and downstream of the first set of electrodes.

5. The apparatus of claim 1, wherein the electrode assembly comprises five pairs of electrodes.

6. The apparatus of claim 1, further comprising an ion source to direct an ion beam through the electrode assembly, wherein the ion beam is disposed between upper electrodes and lower electrodes of the electrode assembly.

7. A method for controlling an ion beam, comprising:
directing the ion beam through an electrode assembly of an electrostatic lens, the electrode assembly comprising a plurality of electrodes;
assigning a plurality of electrode voltages to the plurality of electrodes, wherein the plurality of electrode voltages define a first deceleration length in a first operating mode for a first ion beam having a first perveance; and
decreasing the first deceleration length of the electrode assembly in a second operating mode for a second ion beam having a second perveance, greater than the first perveance.

8. The method of claim 7, wherein the decreasing the first deceleration length comprises:
modifying voltages on the plurality of electrodes to an adjusted set of electrode voltages, wherein the adjusted set of electrode voltages define a second deceleration length, shorter than the first deceleration length.

9. The method of claim 8, wherein the modifying the voltages comprises:
assigning electrode voltages on a first pair of electrodes, disposed at an entrance of the electrode assembly, at a beam terminal voltage, wherein space charge neutralization is maintained;
supplying a suppression voltage to a second pair of electrodes, downstream of the first pair of electrodes; and
adjusting deflection voltages in the electrode assembly to produce an exit trajectory of the ion beam generated by the plurality of electrode voltages, the exit trajectory being approximately the same as a nominal trajectory in the first operating mode.

10. The method of claim 7, wherein the decreasing the first deceleration length comprises:
moving a pair of suppression electrodes from a first position in the first operating mode, to a second position, in the second operating mode, downstream of the first position.

11. The method of claim 7, wherein a first set of electrodes comprises entrance electrodes, and wherein in the first operating mode, a suppression voltage is supplied to a second set of electrodes, immediately adjacent and downstream of the first set of electrodes, wherein decreasing the first deceleration length further comprises assigning the suppression voltage to a third set of electrodes, downstream of the second set of electrodes.

12. The method of claim 11, wherein the decreasing the first deceleration length further comprises moving the third set of electrodes from a first position in the first operating mode to a second position in the second operating mode.

13. A method for controlling an ion beam, comprising:
directing the ion beam through an electrode assembly of an electrostatic lens, the electrode assembly comprising a plurality of electrodes arranged in a plurality of electrode pairs arranged to conduct an ion beam therethrough, wherein a given electrode pair lies along a radius of an arc describing a nominal central ray trajectory, wherein a radius of a first electrode pair and an adjacent electrode pair define an angular spacing, wherein the plurality of electrode pairs defines a plurality of angular spacings, wherein, in a first configuration, the plurality of angular spacings are not all equal;
assigning a plurality of unadjusted electrode voltages to the plurality of electrodes in order to conduct the ion beam along an arc defining a nominal central ray trajectory; and
adjusting the plurality of unadjusted electrode voltages to a set of adjusted electrode voltages, wherein an actual beam path deviates from the nominal central ray trajectory, wherein at least one beam feature of the ion beam is altered.

14. The method of claim 13, further comprising:
using the plurality of unadjusted electrode voltages to decelerate the ion beam at a first location in the electrode assembly;
using the adjusted set of electrode voltages to decelerate the ion beam at a second location in the electrode assembly, the second location upstream with respect to the first location, and wherein energy contamination of the ion beam is reduced.

15. The method of claim 13, further comprising:
using the plurality of unadjusted electrode voltages to direct the ion beam to impinge on a substrate at a first angle of incidence; and
using the adjusted set of electrode voltages to direct the ion beam to impinge on the substrate at a second angle of incidence different from the first angle of incidence.

16. The method of claim 13, further comprising:
using the plurality of unadjusted electrode voltages to deflect the ion beam at a first location in the electrode assembly to impinge on a substrate at a first position; and
using the adjusted set of electrode voltages to deflect the ion beam at a second location in the electrode assembly different from the first location to impinge on the substrate at a second position different from the first position.

* * * * *